(12) United States Patent
Liu

(10) Patent No.: US 11,257,958 B2
(45) Date of Patent: Feb. 22, 2022

(54) THIN FILM TRANSISTOR AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Jingjing Liu, Shenzhen (CN)

( * ) Notice: Subject to any disclaimer, the term of this patent is extended or adjusted under 35 U.S.C. 154(b) by 187 days.

(21) Appl. No.: 16/623,410

(22) PCT Filed: Dec. 10, 2019

(86) PCT No.: PCT/CN2019/124309
§ 371 (c)(1),
(2) Date: Dec. 17, 2019

(87) PCT Pub. No.: WO2021/103136
PCT Pub. Date: Jun. 3, 2021

(65) Prior Publication Data
US 2021/0328061 A1    Oct. 21, 2021

(30) Foreign Application Priority Data

Nov. 26, 2019    (CN) .......................... 20191116989.7

(51) Int. Cl.
*H01L 29/00*    (2006.01)
*H01L 29/786*    (2006.01)
(Continued)

(52) U.S. Cl.
CPC .......... *H01L 29/7869* (2013.01); *H01L 29/45* (2013.01); *H01L 29/66969* (2013.01)

(58) Field of Classification Search
CPC ............. H01L 27/1244; H01L 27/1225; H01L 27/1248; H01L 27/1259; H01L 29/7869; H01L 29/66969; H01L 29/41733; H01L 29/78618; H01L 29/4908; G02B 26/005; G02B 26/02; G02B 26/04
See application file for complete search history.

(56) References Cited

U.S. PATENT DOCUMENTS 5,153,754 A    10/1992   Whetten
8,598,577 B2 *  12/2013  Park .................... H01L 27/1225
                                                  257/43
(Continued)

FOREIGN PATENT DOCUMENTS

CN    103022007 A    4/2013
CN    104681567 A    6/2015

*Primary Examiner* — Nikolay K Yushin

(57) ABSTRACT

The present invention provides a thin film transistor and a manufacturing method thereof. The thin film transistor includes a substrate, a gate electrode, a gate insulating layer, a semiconductor layer, a source electrode and a drain electrode, and a passivation layer. Both structures of the source electrode and the drain electrode are a three-layered metal structure, and the three-layered metal structure is a titanium tantalum/copper/titanium tantalum structure. Therefore, after the passivation layer is applied to the source electrode and the drain electrode, a bulging problem of the passivation layer can be effectively improved, and thus the thin film transistor has better plasticity and can be used for flexible displays.

6 Claims, 2 Drawing Sheets

(51) Int. Cl.
    *H01L 29/45*     (2006.01)
    *H01L 29/66*     (2006.01)
    *H01L 27/00*     (2006.01)

(56) References Cited

U.S. PATENT DOCUMENTS

2012/0018720 A1*   1/2012   Park .................... H01L 27/1214
                                                          257/43
2016/0197107 A1     7/2016   Lee et al.
2016/0233309 A1     8/2016   Miyamoto et al.

\* cited by examiner

THIN FILM TRANSISTOR AND MANUFACTURING METHOD THEREOF

FIELD OF INVENTION

The present invention relates to the technical field of transistors, and in particular, to a structure of a thin film transistor and a manufacturing method thereof.

BACKGROUND OF INVENTION

In thin film transistors (TFTs) used in liquid crystal displays (LCDs), metal layers of a source electrode and a drain electrode are used a two-layered structure with molybdenum/copper (Mo/Cu). For a thin film transistor device equipped with a semiconductor layer of gallium zinc oxide (IGZO) in a back channel etching (BCE) structure, a passivation (PV) layer is usually a silicon oxide (SiOx) layer. However, due to a mismatch of stress between silicon oxide and copper, a silicon oxide film layer is prone to bulge during annealing stages. Therefore, the present invention aims to improve problems of bulging when the passivation layer having the silicon oxide layer is combined with copper.

Technical Problem

A passivation layer of a thin film transistor device is usually a silicon oxide layer, but due to a mismatch between stress of silicon oxide and copper, a silicon oxide film layer is prone to bulge during annealing stages.

Technical Solution

In order to solve the above technical problems, an object of the present invention is to provide a thin film transistor, which can effectively improve problems of bulging when a passivation layer is combined with a source electrode and a drain electrode, and make the thin film transistor have better plasticity and can be used for flexible displays.

To achieve the above object, the present invention provides a thin film transistor comprising a substrate, a gate electrode, a gate insulating layer, a semiconductor layer, a source electrode and a drain electrode, and a passivation layer. The gate electrode is disposed on the substrate. The gate insulating layer is disposed on the gate electrode and covers the gate electrode. The semiconductor layer is disposed on the gate insulating layer and partially covers the gate insulating layer. The source electrode and the drain electrode are formed on the semiconductor layer, wherein the source electrode and the drain electrode are spaced apart from each other. The passivation layer is formed on the source electrode, the drain electrode, the semiconductor layer, and the gate insulating layer. Wherein both structures of the source electrode and the drain electrode are a three-layered metal structure, a middle layer of the three-layered metal structure is copper (Cu), and the semiconductor layer is a gallium zinc oxide (IGZO) layer or an amorphous silicon (a-Si) layer.

In an embodiment of the present invention, a first layer of the three-layered metal structure is a titanium-tantalum alloy, a second layer of the three-layered metal structure is copper, and a third layer of the three-layered metal structure is a titanium-tantalum alloy.

In an embodiment of the present invention, an atomic ratio range of a titanium element and a tantalum element ranges from 25 to 35:65 to 75.

To achieve the above object, the present invention provides a thin film transistor comprising a substrate, a gate electrode, a gate insulating layer, a semiconductor layer, a source electrode and a drain electrode, and a passivation layer. The gate electrode is disposed on the substrate. The gate insulating layer is disposed on the gate electrode and covers the gate electrode. The semiconductor layer is disposed on the gate insulating layer and partially covers the gate insulating layer. The source electrode and the drain electrode are formed on the semiconductor layer, wherein the source electrode and the drain electrode are spaced apart from each other. The passivation layer is formed on the source electrode, the drain electrode, the semiconductor layer, and the gate insulating layer. Wherein both structures of the source electrode and the drain electrode are a three-layered metal structure.

In an embodiment of the present invention, a middle layer of the three-layered metal structure is copper.

In an embodiment of the present invention, a first layer of the three-layered metal structure is a titanium-tantalum alloy, a second layer of the three-layered metal structure is copper, and a third layer of the three-layered metal structure is a titanium-tantalum alloy.

In an embodiment of the present invention, an atomic ratio range of a titanium element and a tantalum element ranges from 25 to 35:65 to 75.

In an embodiment of the present invention, the semiconductor layer is a gallium zinc oxide (IGZO) layer or an amorphous silicon (a-Si) layer.

To achieve the above object, the present invention provides a manufacturing method of a thin film transistor, comprising following steps of:

providing a substrate;

forming a gate electrode on the substrate;

forming a gate insulating layer on the gate electrode;

forming a semiconductor layer disposed on the gate insulating layer;

forming a source electrode and a drain electrode on the semiconductor layer; and forming a passivation layer on the source electrode, the drain electrode, the semiconductor layer, and the gate insulating layer;

wherein the source electrode and the drain electrode are obtained by simultaneously etching a three-layered metal structure.

In an embodiment of the present invention, the source electrode and the drain electrode are obtained by etching the three-layered metal structure with copper acid.

In an embodiment of the present invention, the gate electrode is formed by a physical vapor deposition method, and is patterned by a photolithography process and a wet etching method.

In an embodiment of the present invention, the semiconductor layer is formed by physical vapor deposition or chemical vapor deposition, and is patterned by photolithography and etching.

In order to make the above contents of the present invention more comprehensible, the following describes the preferred embodiments and the accompanying drawings in detail, as follows.

Beneficial Effect

A thin film transistor provided by the present invention can effectively improve a bulging problem when a passivation layer is combined with a source electrode and a drain electrode, and make the thin film transistor have better plasticity and can be used for flexible displays.

DETAILED DESCRIPTION OF PREFERRED EMBODIMENTS

In order to make the above and other objects, features, and advantages of the present disclosure more comprehensible, the following describes the preferred embodiments of the present invention in conjunction with the accompanying drawings for detailed description as follows. Furthermore, directional terms mentioned in the present invention, such as up, down, top, bottom, front, back, left, right, inner, outer, side, surrounding, center, horizontal, horizontal, vertical, longitudinal, axial, radial, uppermost or lowermost, etc., only refer to directions of additional drawings. Therefore, the directional terms used is for the purpose of illustration and understanding of the disclosure rather than limiting the disclosure.

In the figures, units having similar structures are used for the same reference numbers.

Figure 1:
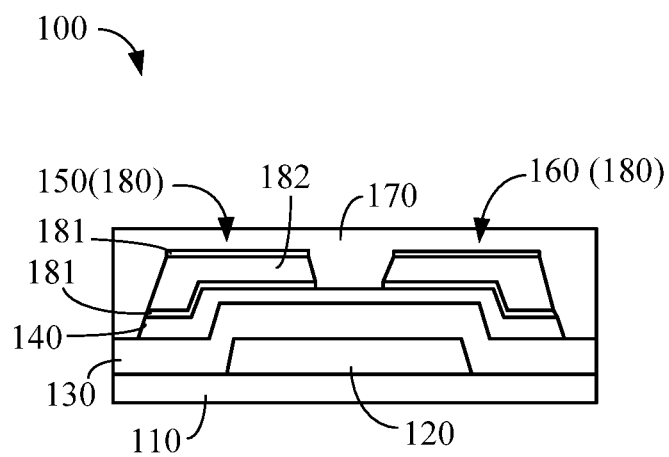
FIG. 1 is a schematic view of a thin film transistor of the present invention.
Figure 2:
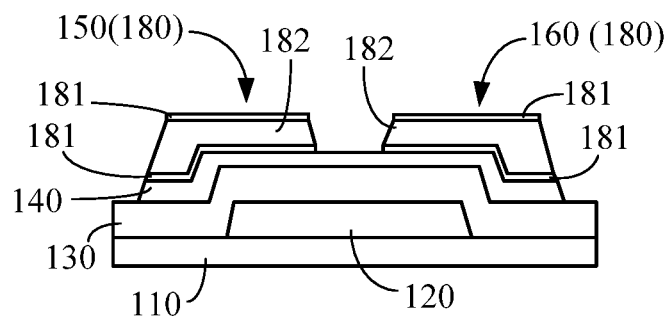
FIG. 2 is a schematic view of the thin film transistor according to the present invention after removing a passivation layer.

As shown in FIG. 1 to FIG. 2, an object of the present invention is to provide a thin film transistor 100. The thin film transistor 100 comprises a substrate 110, a gate electrode 120, a gate insulating layer 130, a semiconductor layer 140, a source electrode 150 and a drain electrode 160, and a passivation layer 170. Both structures of the source electrode 150 and the drain electrode 160 are a three-layered metal structure 180, and the three-layered metal structure 180 is a titanium tantalum/copper/titanium tantalum (TaTi/Cu/TaTi) structure. Therefore, after the passivation layer 170 is applied to the source electrode 150 and the drain electrode 160, a bulging problem of the passivation layer 170 can be effectively improved, and the thin film transistor 100 has better plasticity and can be used for flexible displays.

The structure of the thin film transistor 100 disclosed in the invention is described in detail as follows:

As shown in FIG. 1, the gate electrode 120 is disposed on the substrate 110. The gate insulating layer 130 is disposed on the gate electrode 120 and covers the gate electrode 120. The semiconductor layer 140 is disposed on the gate insulating layer 130 and partially covers the gate insulating layer 130.

The source electrode 150 and the drain electrode 160 are formed on the semiconductor layer 140, and the source electrode 150 and the drain electrode 160 are spaced apart from each other. The passivation layer 170 is formed on the source electrode 150, the drain electrode 160, the semiconductor layer 140, and the gate insulating layer 130. Therefore, the passivation layer 170 is used to cover the source electrode 150, the drain electrode 160, the gate insulating layer 130, and the semiconductor layer 140 from top to bottom. Wherein, both the structures of the source electrode 150 and the drain electrode 160 are a three-layered metal structure 180.

As shown in FIG. 2, the three-layered metal structure 180 is composed of two first metal structures 181 sandwiching a second metal structure 182 from an upper side and a lower side, respectively. The first metal structure 181 is a titanium tantalum (TiTa) alloy, the second metal structure 182 is copper (Cu), and the three-layered metal structure 180 is titanium tantalum/copper/titanium tantalum (TiTa/Cu/TiTa) structure.

In addition, a copper acid used for the source electrode 150 and the drain electrode 160 needs to contain at least the following four components: hydrogen oxide ($H_2O_2$), nitric acid ($HNO_3$), hydrogen fluoride (HF) and other additives (etch inhibitors, chelating agents, etc.).

In other words, since the titanium tantalum alloy of the first metal structure 181 can not only match stress of the silicon oxide layer (SiOx) constituting the passivation layer 170, the titanium tantalum alloy of the first metal structure 181 can also has excellent super-plasticity that can be applied to the flexible displays, and can realize bending with a large curvature.

In the present invention, the gate electrode 120 is copper. The semiconductor layer 140 is a gallium zinc oxide (IGZO) layer or an amorphous silicon (a-Si) layer. The passivation layer 170 is a silicon oxide layer (SiOx).

Figure 3:
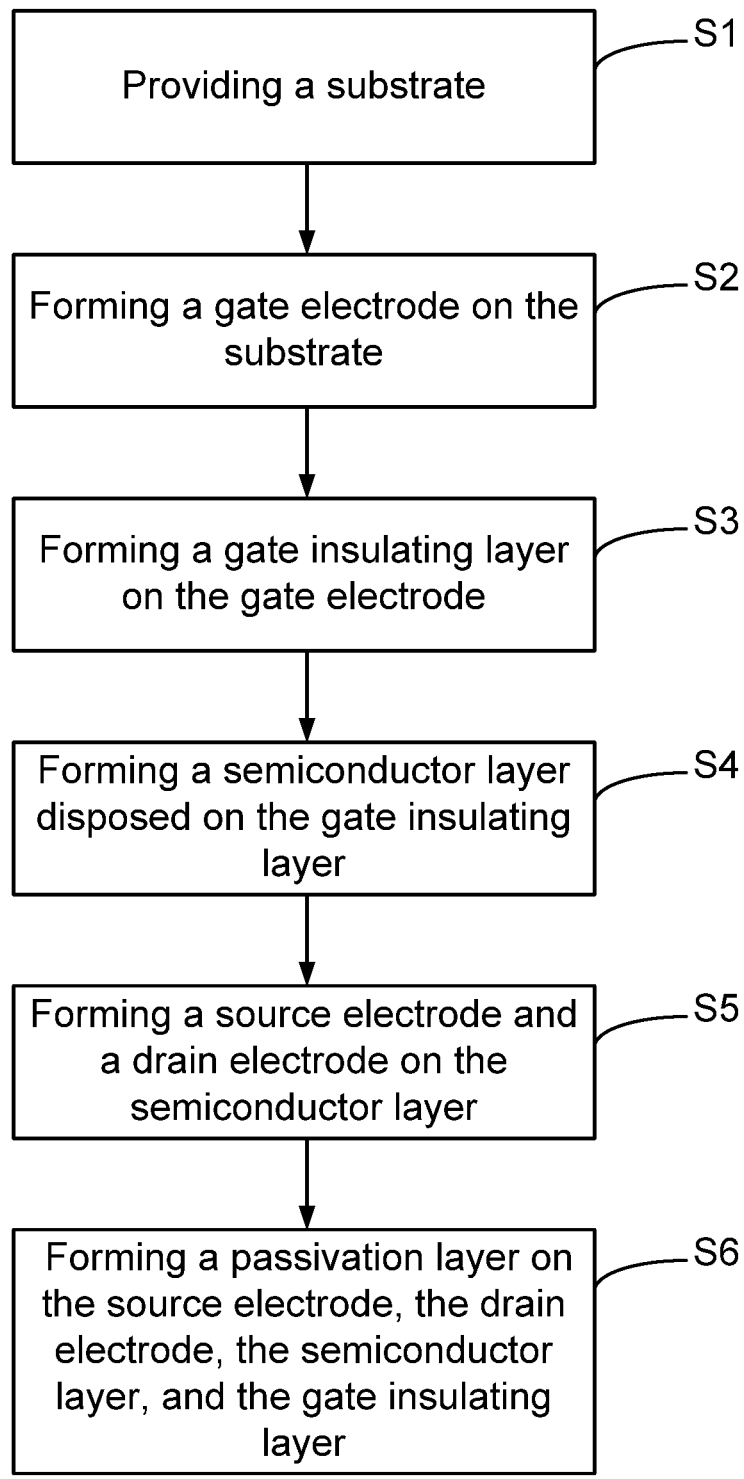
FIG. 3 is a flowchart of a manufacturing method of the thin film transistor of the present invention.

As shown in FIG. 3, a manufacturing method of the thin film transistor of the present invention comprises following steps of:

S1: providing a substrate 110;

S2: forming a gate electrode 120 on the substrate 110;

S3: forming a gate insulating layer 130 on the gate electrode 120;

S4: forming a semiconductor layer 140 disposed on the gate insulating layer 130;

S5: forming a source electrode 150 and a drain electrode 160 on the semiconductor layer 140; and S6: forming a passivation layer 170 on the source electrode 150, the drain electrode 160, the semiconductor layer 140, and the gate insulating layer 130;

wherein the source electrode 150 and the drain electrode 160 are obtained by simultaneously etching a three-layered metal structure.

A manufacturing method of each layer will be described below.

In the present invention, the gate electrode 120 can be formed by a physical vapor deposition method, and patterned by a photolithography process and a wet etching method. The semiconductor layer 140 can be formed by physical vapor deposition or chemical vapor deposition, and patterned by photolithography and etching. The first metal structure 181 can be formed by a physical vapor deposition method, and patterned by a photolithography process and a wet etching method. The passivation layer 170 can be formed by a chemical vapor deposition method, and patterned by photolithography and dry etching.

In addition, in a preferred embodiment of the present invention, an atomic ratio range of a titanium (Ti) element and a tantalum (Ta) element ranges from 25 to 35:65 to 75. Through the above atomic ratio, the titanium tantalum alloy can not only match the stress of the silicon oxide layer constituting the passivation layer 170, but also can have excellent super-plasticity, which can be applied to the flexible displays, and can realize bending with a large curvature.

In summary, since the thin film transistor 100 provided by the present invention can make the titanium tantalum alloy of the first metal structure 181 of the three-layered metal structure 180 to be arranged by the three-layered metal structure 180 matching the stress of the silicon oxide layer constituting the passivation layer 170 to improve the problem that the passivation layer bulges on the copper surface in the prior art, and the titanium tantalum alloy of the first metal structure 181 also has excellent super-plasticity, and can be applied to the flexible displays to achieve large curvature bending, and therefore can be applied to liquid crystal displays, active organic light emitting diode displays (AMOLED), and other flexible displays.

Although the present invention has been shown and described with respect to one or more implementations, those skilled in the art will recognize equivalent variations and modifications upon reading and understanding the present specification and drawings. The disclosure includes all such modifications and alterations and is limited only by the scope of the following claims. In particular with regard to the various functions performed by the aforementioned components, the terminology used to describe such components is intended to correspond to any component (unless otherwise indicated) that performs the specified function of the component (eg, it is functionally equivalent). Even if it is not structurally equivalent to a public structure that performs the functions in the exemplary implementation of this specification shown herein. Furthermore, although a particular feature of the specification has been disclosed with respect to only one of several implementations, this feature may be compared to one or more of other implementations as may be desirable and advantageous for a given or specific application Other feature combinations. Moreover, to the extent that the terms "including," "having," "containing," or variations thereof are used in the detailed description or claims, such terms are intended to include in a manner similar to the term "comprising."

In the above, various other corresponding changes and modifications can be made according to the technical solutions and technical ideas of the present invention to those skilled in the art, and all such changes and modifications are within the scope of the claims of the present invention.

What is claimed is:

1. A thin film transistor, comprising:
   a substrate;
   a gate electrode disposed on the substrate;
   a gate insulating layer disposed on the gate electrode and covering the gate electrode;
   a semiconductor layer disposed on the gate insulating layer and partially covering the gate insulating layer;
   a source electrode and a drain electrode formed on the semiconductor layer, wherein the source electrode and the drain electrode are spaced apart from each other; and
   a passivation layer formed on the source electrode, the drain electrode, the semiconductor layer, and the gate insulating layer;
   wherein both structures of the source electrode and the drain electrode are a three-layered metal structure, a middle layer of the three-layered metal structure is copper, and the semiconductor layer is a gallium zinc oxide layer or an amorphous silicon layer;
   wherein a first layer of the three-layered metal structure is a titanium-tantalum alloy, a second layer of the three-layered metal structure is copper, and a third layer of the three-layered metal structure is a titanium-tantalum alloy; and
   wherein an atomic ratio range of a titanium element and a tantalum element ranges from 25 to 35:65 to 75.

2. A manufacturing method of the thin film transistor as claimed in claim 1, comprising following steps of:
   providing the substrate;
   forming the gate electrode on the substrate;
   forming the gate insulating layer on the gate electrode;
   forming the semiconductor layer disposed on the gate insulating layer;
   forming the source electrode and a drain electrode on the semiconductor layer; and
   forming the passivation layer on the source electrode, the drain electrode, the semiconductor layer, and the gate insulating layer;
   wherein the source electrode and the drain electrode are obtained by simultaneously etching a three-layered metal structure.

3. The manufacturing method as claimed in claim 2, wherein the source electrode and the drain electrode are obtained by etching the three-layered metal structure with copper acid.

4. The manufacturing method as claimed in claim 2, wherein the gate electrode is formed by a physical vapor deposition method, and is patterned by a photolithography process and a wet etching method.

5. The manufacturing method as claimed in claim 2, wherein the semiconductor layer is formed by physical vapor deposition or chemical vapor deposition, and is patterned by photolithography and etching.

6. A thin film transistor, comprising:
   a substrate;
   a gate electrode disposed on the substrate;
   a gate insulating layer disposed on the gate electrode and covering the gate electrode;
   a semiconductor layer disposed on the gate insulating layer and partially covering the gate insulating layer;
   a source electrode and a drain electrode formed on the semiconductor layer, wherein the source electrode and the drain electrode are spaced apart from each other; and
   a passivation layer formed on the source electrode, the drain electrode, the semiconductor layer, and the gate insulating layer;
   wherein both structures of the source electrode and drain electrode are a three-layered metal structure;
   wherein a middle layer of the three-layered metal structure is copper;
   wherein a first layer of the three-layered metal structure is a titanium-tantalum alloy, a second layer of the three-layered metal structure is copper, and a third layer of the three-layered metal structure is a titanium-tantalum alloy;
   wherein an atomic ratio range of a titanium element and a tantalum element ranges from 25 to 35:65 to 75; and
   wherein the semiconductor layer is a gallium zinc oxide layer or an amorphous silicon layer.

* * * * *

UNITED STATES PATENT AND TRADEMARK OFFICE
CERTIFICATE OF CORRECTION

| | | |
|---|---|---|
| PATENT NO. | : 11,257,958 B2 | Page 1 of 1 |
| APPLICATION NO. | : 16/623410 | |
| DATED | : February 22, 2022 | |
| INVENTOR(S) | : Jingjing Liu | |

It is certified that error appears in the above-identified patent and that said Letters Patent is hereby corrected as shown below:

On the Title Page

Item (30) should be corrected as follows:
(30) Foreign Application Priority Data
Nov. 26, 2019 (CN) ..................... 201911169839.7

Signed and Sealed this
Sixteenth Day of July, 2024

Katherine Kelly Vidal
*Director of the United States Patent and Trademark Office*